US010585461B2

(12) United States Patent
Suzuki

(10) Patent No.: US 10,585,461 B2
(45) Date of Patent: Mar. 10, 2020

(54) SUBSTRATE GUIDE MEMBER AND CASING

(71) Applicant: NEC Platforms, Ltd., Kawasaki-shi, Kanagawa (JP)

(72) Inventor: Takeshi Suzuki, Kanagawa (JP)

(73) Assignee: NEC Platforms, Ltd., Kawasaki-shi, Kanagawa (JP)

( * ) Notice: Subject to any disclaimer, the term of this patent is extended or adjusted under 35 U.S.C. 154(b) by 0 days.

(21) Appl. No.: 15/567,717

(22) PCT Filed: Aug. 17, 2016

(86) PCT No.: PCT/JP2016/003754
§ 371 (c)(1),
(2) Date: Oct. 19, 2017

(87) PCT Pub. No.: WO2017/168470
PCT Pub. Date: Oct. 5, 2017

(65) Prior Publication Data
US 2018/0150113 A1     May 31, 2018

(30) Foreign Application Priority Data

Mar. 29, 2016     (JP) ................................ 2016-065280

(51) Int. Cl.
*G06F 1/18* (2006.01)
*H05K 7/14* (2006.01)

(52) U.S. Cl.
CPC .............. *G06F 1/185* (2013.01); *G06F 1/183* (2013.01); *H05K 7/14* (2013.01); *H05K 7/1418* (2013.01)

(58) Field of Classification Search
CPC ..... G06F 1/185; G06F 1/183; B29C 33/3807; B29C 33/42; H05K 7/1418; H05K 7/14
(Continued)

(56) References Cited

U.S. PATENT DOCUMENTS 4,797,784 A    1/1989  Belanger, Jr.
5,154,631 A   10/1992  Belanger, Jr.
(Continued)

FOREIGN PATENT DOCUMENTS

CN            2662595 Y    12/2004
CN            2714283 Y     8/2005
(Continued)

OTHER PUBLICATIONS

Communication dated Feb. 27, 2018 from the European Patent Office in counterpart application No. 16896691.9.
(Continued)

*Primary Examiner* — Daniel P Wicklund
*Assistant Examiner* — Sagar Shrestha
(74) *Attorney, Agent, or Firm* — Sughrue Mion, PLLC

(57) ABSTRACT

A substrate guide member is integrally formed of resin, and includes: a support portion fixed in a casing; and at least one pair of a first protrusion and a second protrusion protruding from the support portion and extending in an insertion direction with a gap from each other, to thereby form a groove for allowing passage of a substrate. The at least one pair of the first protrusion and the second protrusion includes: a plurality of guide portions configured to guide the substrate; and separated portions, which are portions connecting the plurality of guide portions and have a gap larger than the gap of the plurality of guide portions.

4 Claims, 7 Drawing Sheets

(58) Field of Classification Search
USPC .......................................... 439/61, 64, 631
See application file for complete search history.

(56) References Cited

U.S. PATENT DOCUMENTS

| | | | |
|---|---|---|---|
| 5,187,648 A | | 2/1993 | Ito |
| 5,277,615 A * | | 1/1994 | Hastings ................ G06F 1/181 |
| | | | 361/679.32 |
| 5,467,254 A * | | 11/1995 | Brusati ................ H05K 7/1409 |
| | | | 174/355 |
| 5,533,631 A * | | 7/1996 | Marchetti ............ H05K 7/1418 |
| | | | 211/41.17 |
| 5,805,429 A * | | 9/1998 | Andersson ........... H05K 7/1418 |
| | | | 174/359 |
| 6,396,690 B1 * | | 5/2002 | Blatti ..................... G06F 1/184 |
| | | | 211/41.17 |
| 6,469,889 B1 | | 10/2002 | Gan |
| 6,728,114 B2 * | | 4/2004 | Serjack ................ H05K 7/1418 |
| | | | 211/41.17 |
| 7,167,380 B2 | | 1/2007 | Ice |
| 7,320,615 B2 * | | 1/2008 | Fang ..................... H05K 7/1418 |
| | | | 439/377 |
| 2004/0031767 A1 * | | 2/2004 | Ice ....................... H05K 7/1404 |
| | | | 211/26 |
| 2004/0150973 A1 * | | 8/2004 | Junkins ................ H05K 7/1418 |
| | | | 361/801 |
| 2006/0133054 A1 | | 6/2006 | Haag et al. |
| 2007/0093092 A1 | | 4/2007 | Fang |
| 2012/0002385 A1 * | | 1/2012 | Hanna ..................... G06F 1/185 |
| | | | 361/756 |

FOREIGN PATENT DOCUMENTS

| | | |
|---|---|---|
| CN | 101622157 A | 1/2010 |
| JP | 48-052860 U | 7/1973 |
| JP | 51039168 Y2 | 9/1976 |
| JP | 62-68292 U | 4/1987 |
| JP | 2002-103395 A | 4/2002 |
| JP | 2002-164677 A | 6/2002 |
| JP | 2004-343048 A | 12/2004 |

OTHER PUBLICATIONS

Communication dated Mar. 22, 2018 from the Australian Patent Office in counterpart application No. 2016399724.
Notification for Reasons of Refusal for JP 2016-065280 dated Dec. 27, 2016.
International Search Report for PCT/JP2016/003754 dated Sep. 20, 2016.
Office Action dated Jul. 5, 2019 in Chinese Application No. 201680024106.2.

* cited by examiner

SUBSTRATE GUIDE MEMBER AND CASING

CROSS REFERENCE TO RELATED APPLICATIONS

This application is a National Stage of International Application No. PCT/JP2016/003754filed Aug. 17, 2016, claimed priority based on Japanese Patent Application No. 2016-065280filed Mar. 29, 2016, the contents of all of which are incorporated by reference in their entirety.

TECHNICAL FIELD

This invention relates to a substrate guide member and a casing.

BACKGROUND ART

As a casing in which a substrate is received, for example, there has been known a casing according to a reference example illustrated in FIG. 7. The casing according to the reference example has, in a front surface thereof, a total of four slots for allowing insertion of substrates. Specifically, two slots are arrayed in each of an up-and-down direction and a right-and-left direction. Further, as illustrated in FIG. 8, in order to guide the substrates to be inserted, the casing according to the reference example includes three substrate guide members arrayed in the right-and-left direction.

Those substrate guide members are required to guide the substrate so that a terminal provided on a rear side in the casing and a terminal provided to the substrate are reliably connected to each other. Therefore, the substrate guide members are often designed so as to prevent formation of a sink mark in order to manufacture the substrate guide members with high accuracy by resin molding.

For example, in Patent Document 1, there is disclosed that a portion having a larger thickness than other portions, that is, a portion which is formed so as to have a large thickness is delayed in cooling time as compared to a portion which is not formed so as to have a large thickness, with the result that a sink mark may be formed in a surface.

Each of the substrate guide members according to the reference example is also designed without a large-thickness portion so as to prevent formation of the sink mark. In particular, the substrate guide member provided at the center has guide portions for guiding the substrate on both right and left sides. Therefore, the substrate guide member provided at the center often includes a large-thickness portion. Thus, as illustrated in FIG. 8, the substrate guide member provided at the center according to the reference example is sometimes manufactured by forming right and left divided pieces by resin molding and combining the divided pieces after the molding. In this manner, the formation of the sink mark caused by the large thickness of the substrate guide member provided at the center can be suppressed.

PRIOR ART DOCUMENTS

Patent Document

Patent Document 1: JP 2002-103395 A

SUMMARY OF THE INVENTION

Problem to be Solved by the Invention

However, the substrate guide member provided at the center according to the reference example is manufactured by forming the right and left divided pieces by resin molding, with the result that the number of components is increased. Further, it requires a labor to combine the components which are molded in divided pieces.

This invention has been made in view of the above-mentioned circumstances, and has an object to provide, for example, a substrate guide member which is integrally formed by resin molding with high accuracy.

Means to Solve the Problem

A substrate guide member according to a first aspect of this invention, which is arranged in a casing having a slot for allowing insertion of a substrate from an outside so as to be arrayed in an array direction intersecting an insertion direction of the substrate and is configured to guide the substrate in the insertion direction, the substrate guide member being integrally formed of resin and comprising:

a support portion fixed in the casing; and at least one pair of a first protrusion and a second protrusion protruding from the support portion and extending in the insertion direction with a gap each other, to thereby form a groove for allowing passage of the substrate, the at least one pair of the first protrusion and the second protrusion comprising:

a plurality of guide portions, which have a gap in accordance with a thickness of the substrate and are configured to guide the substrate in the insertion direction; and separated portions, which are portions connecting the plurality of guide portions and have a gap larger than the gap of the plurality of guide portions.

A substrate guide member according to a second aspect of this invention, which is arranged in a casing having a slot for allowing insertion of a substrate from an outside so as to be arrayed in an array direction intersecting an insertion direction of the substrate and is configured to guide the substrate in the insertion direction, the substrate guide member being integrally formed of resin and comprising:

a support portion fixed in the casing; and at least one pair of a first protrusion and a second protrusion protruding from the support portion and extending in the insertion direction with a gap each other, to thereby form a groove for allowing passage of the substrate, the support portion having through holes in the array direction between mounting positions of the at least one pair of the first protrusion and the second protrusion.

A casing according to a third aspect of this invention, comprising:

a cover portion having a slot for allowing insertion of a substrate from an outside; and a plurality of substrate guide members, which are arranged in the cover portion so as to be arrayed in an array direction intersecting an insertion direction of the substrate and are each integrally formed of resin, the plurality of substrate guide members each comprising:

a support portion fixed in the cover portion; and at least one pair of a first protrusion and a second protrusion protruding from the support portion to an adjacent substrate guide member and extending in the insertion direction with a gap each other, to thereby form a groove for allowing passage of the substrate, the at least one pair of the first protrusion and the second protrusion comprising:

a plurality of guide portions, which have a gap in accordance with a thickness of the substrate and are configured to guide the substrate in the insertion direction; and separated portions, which are portions connecting the plurality of guide portions and have a gap larger than the gap of the plurality of guide portions.

A casing according to a third aspect of this invention, comprising:

a cover portion having a slot for allowing insertion of a substrate from an outside; and a plurality of substrate guide members, which are arranged in the cover portion so as to be arrayed in an array direction intersecting an insertion direction of the substrate and are each integrally formed of resin, the plurality of substrate guide members each comprising:
a support portion fixed in the cover portion; and
at least one pair of a first protrusion and a second protrusion protruding from the support portion to an adjacent substrate guide member and extending in the insertion direction with a gap each other, to thereby form a groove for allowing passage of the substrate, the support portion comprising through holes in the array direction between mounting positions of the at least one pair of the first protrusion and the second protrusion.

Effect of the Invention

According to this invention, it is possible to provide, for example, the substrate guide member which is integrally formed by molding with high accuracy.

MODE FOR EMBODYING THE INVENTION

Description is made of one embodiment of this invention with reference to the drawings. In the following description, directions are described with use of terms front, rear, up, down, right, and left. However, those terms are used for description and are not intended to delimit this invention.

Figure 1:
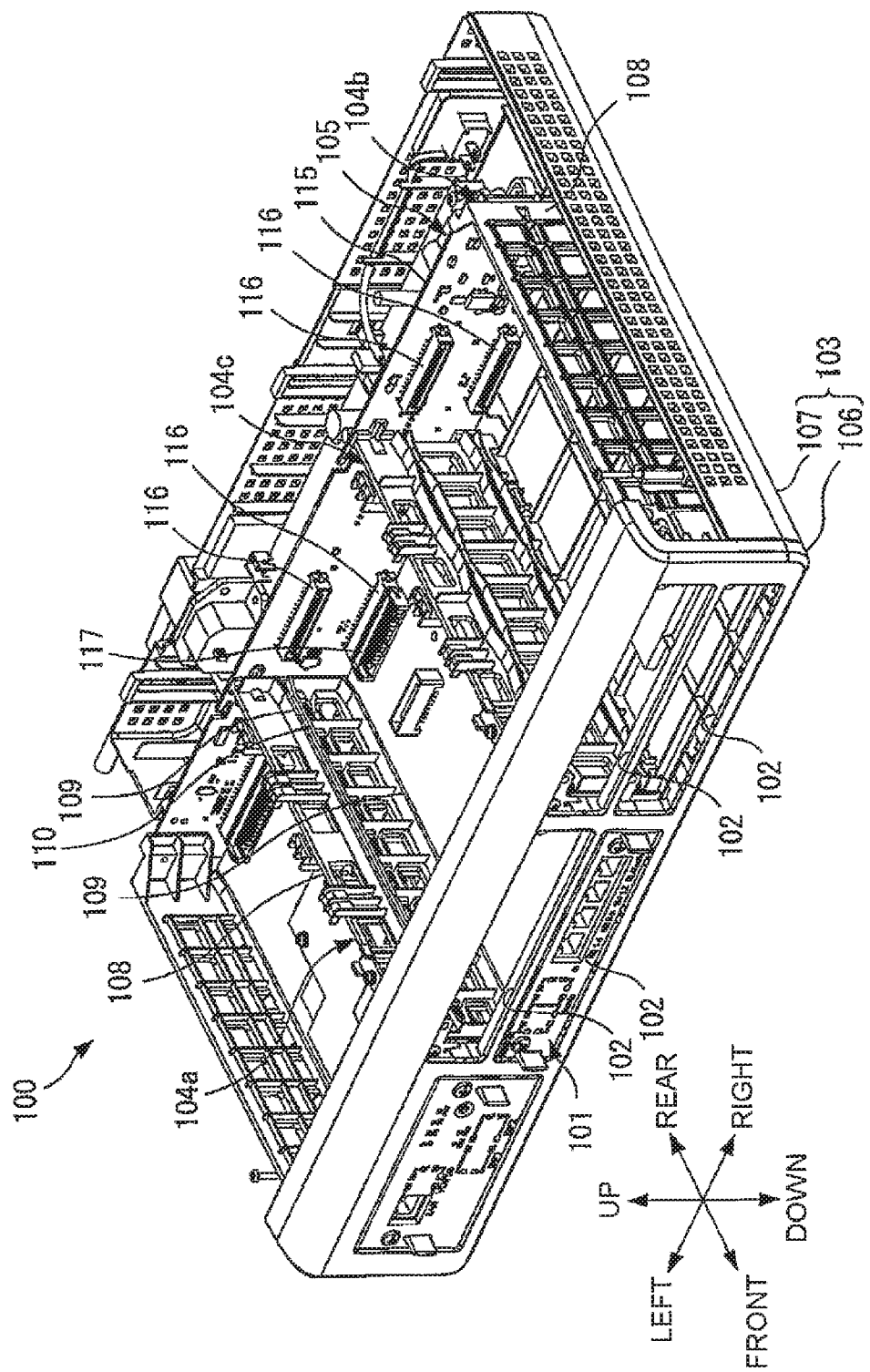
FIG. 1 is a perspective view for illustrating a casing according to one embodiment of this invention under a state in which an upper cover is removed.

As illustrated in FIG. 1, a casing 100 according to one embodiment of this invention is a box body in which a substrate 101 is arranged. In the casing 100, there are also suitably arranged a power supply device and members such as various wires in addition to the substrate 101.

As illustrated in FIG. 1, the casing 100 includes a cover portion 103, three substrate guide members 104a, 104b, and 104c, and a terminal holding member 105. The cover portion 103, the three substrate guide members 104a, 104b, and 104c, and the terminal holding member 105 are fixed to each other, for example, by fitting or by fastening with screws.

In the following, the three substrate guide members 104a, 104b, and 104c are also described as "substrate guide members 104" unless otherwise distinguished.

The cover portion 103 generally surrounds a space for receiving various components. The cover portion 103 of this embodiment includes a front cover 106, a lower cover 107, and an upper cover (not shown). The front cover 106, the lower cover 107, and the upper cover are fixed, for example, by fitting or by fastening with screws, thereby forming the integral cover portion 103.

As illustrated in FIG. 1, the front cover 106 includes slots 102. Two slots 102 are arrayed in each of an up-and-down direction and a right-and-left direction. The slots 102 are each an opening for allowing insertion of the substrate 101 from an outside. In the example of the casing 100 illustrated in FIG. 1, the substrate 101 is inserted to the lower left slot 102.

The three substrate guide members 104 are members configured to guide the substrate 101 in a rearward direction, and are arranged in the cover portion 103 so as to be arrayed in the right-and-left direction. The substrate guide members 104 according to this embodiment are each integrally formed of resin and fixed to the cover portion 103 and the terminal holding member 105.

In this embodiment, the rearward direction corresponds to an insertion direction of the substrate 101. Further, in this embodiment, the right-and-left direction corresponds to an array direction intersecting the insertion direction of the substrate 101.

Specifically, the substrate guide members 104 each include a support portion 108 and at least one pair of a first protrusion 109 and a second protrusion 110.

The support portion 108 is fixed in the cover portion 103. The support portion 108 of this embodiment has a generally planar shape and has ribs and holes which are suitably formed.

The support portion 108 of this embodiment has a plurality of through holes 111 in the right-and-left direction between mounting positions of the first protrusion 109 and the second protrusion 110 constructing each of a plurality of guide portions 113 described later in detail (for example, see FIG. 3 which is a right side view of the substrate guide member 104c).

As illustrated in FIG. 1, each pair of the first protrusion 109 and the second protrusion 110 protrudes from the support portion 108 toward the adjacent substrate guide member 104a, 104b, or 104c and extends in the rearward direction while being spaced apart in the up-and-down direction. With this configuration, each pair of the first protrusion 109 and the second protrusion 110 forms a groove extending in the rearward direction for allowing passage of the substrate 101.

The first protrusion 109 and the second protrusion 110 correspond to a protrusion formed at an upper position and a protrusion formed at a lower position of the protrusions which are formed on the support portion 108 so as to form a pair for guiding the substrate 101. Further, the terms "extending rearward" include not only a state of extending rearward from a front end substantially straight but also a state of extending rearward from the front end while being curved, bent, or flexed.

In this embodiment, the substrate guide member 104a positioned at a left end and the substrate guide member 104b positioned at a right end have substantially right-left symmetrical shapes and each include two pairs of the first protruding threat portion 109 and the second protrusion 110 protruding toward the substrate guide member 104c. The pairs of the first protrusion 109 and the second protrusion 110 provided to each of the substrate guide member 104a and the substrate guide member 104b are arrayed in the up-and-down direction. Each of the first protrusions 109 and the second protrusions 110 provided to each of the substrate guide member 104a and the substrate guide member 104b protrudes rearward from the front end substantially straight.

Further, the substrate guide member 104 other than the substrate guide members 104a and 104b positioned at the left and right ends, that is, the substrate guide member 104c positioned in the middle includes, as illustrated in FIG. 2 to FIG. 6, four pairs of the first protrusion 109 and the second protrusion 110.

Specifically, the substrate guide member 104c includes two pairs of the first protrusion 109 and the second protrusion 110 protruding from a left surface of the support portion 108 toward the substrate guide member 104a, that is, protruding in a leftward direction. The substrate guide member 104c includes two pairs of the first protrusion 109 and the second protrusion 110 protruding from a right surface of the support portion 108 toward the substrate guide member 104b, that is, protruding in a rightward direction.

Figure 2:
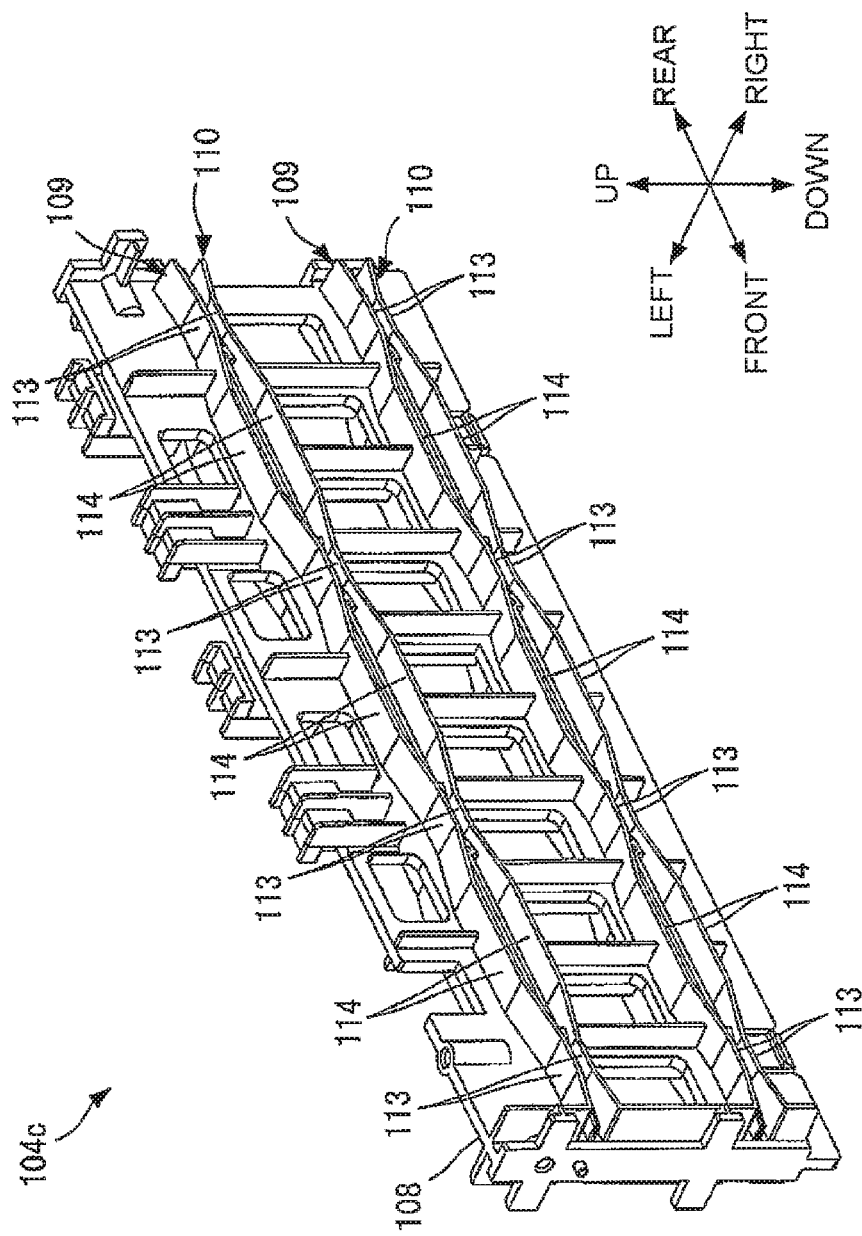
FIG. 2 is a perspective view for illustrating a substrate guide member according to one embodiment of this invention.
Figure 4:
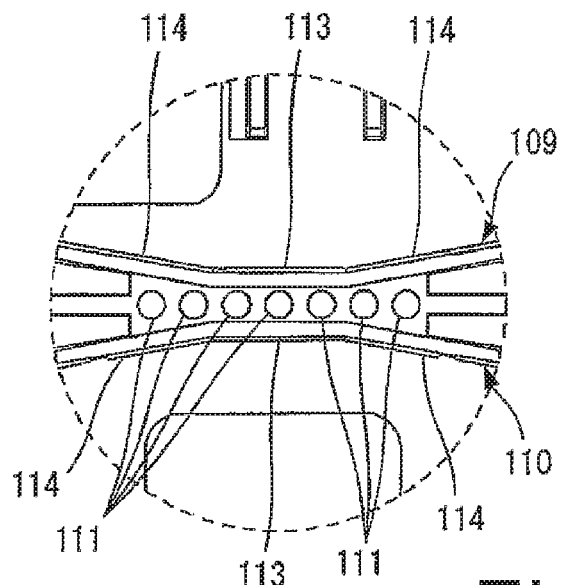
FIG. 4 is an enlarged view for illustrating one of portions surrounded by dot lines in FIG. 3.
Figure 5:
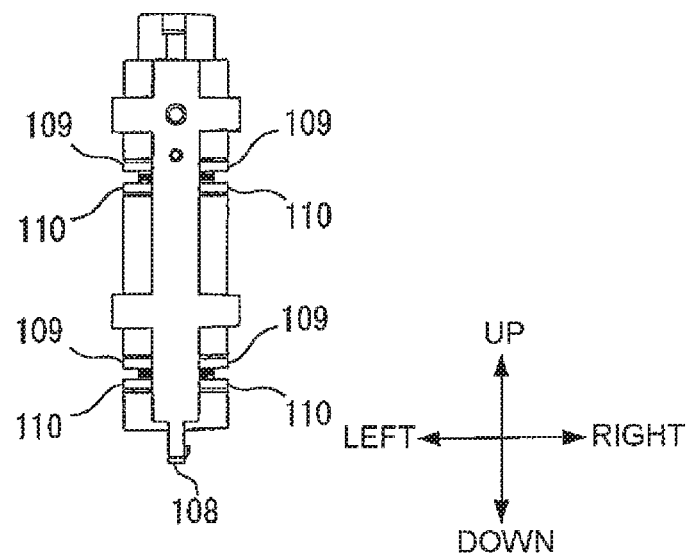
FIG. 5 is a front view for illustrating the substrate guide member according to the one embodiment.
Figure 6:
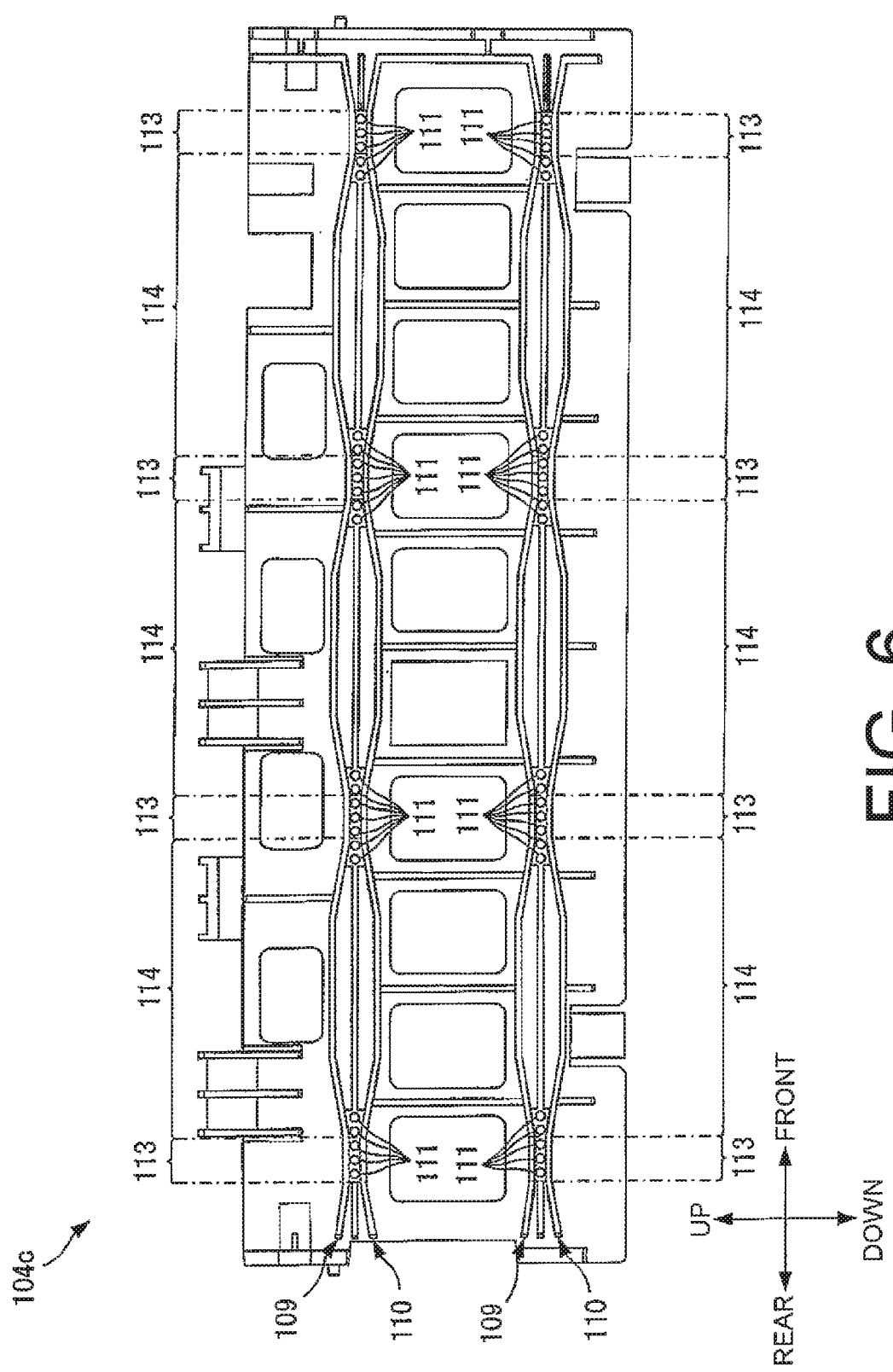
FIG. 6 is a left side view for illustrating the substrate guide member according to the one embodiment.

FIG. 2 is a perspective view for illustrating the substrate guide member 104c. FIG. 3 is a right side view for illustrating the substrate guide member 104c. FIG. 4 is an enlarged view for illustrating portions surrounded by a dotted line circle (112) illustrated in FIG. 3. FIG. 5 is a front view for illustrating the substrate guide member 104c. FIG. 6 is a left side view for illustrating the substrate guide member 104c.

The pairs of the first protrusion 109 and the second protrusion 110 protruding in the leftward direction on the substrate guide member 104c are arrayed in the up-and-down direction. The pairs of the first protrusion 109 and the second protrusion 110 protruding in the rightward direction on the substrate guide member 104c are arrayed in the up-and-down direction.

The pairs of the first protrusion 109 and the second protrusion 110 protruding on an upper side from each of the right and left surfaces of the support portion 108 protrude from portions of the support portion 108, which are opposed to each other in the right-and-left direction, toward the adjacent substrate guide members 104a and 104b. The pairs of the first protrusion 109 and the second protrusion 110 protruding on a lower side from each of the right and left surfaces of the support portion 108 also protrude from portions of the support portion 108, which are opposed to each other in the right-and-left direction, toward the adjacent substrate guide members 104a and 104b.

In this embodiment, the portions of the support portion 108, which are opposed to each other in the right-and-left direction, means that the portions are located at the same positions in the up-and-down direction in each main surface of the left surface and the right surface of the support portion 108.

Each of the first protrusions 109 and the second protrusions 110 provided to the substrate guide member 104c extends rearward from the front end while including flexed portions. With this structure, there are formed a plurality of guide portions 113 and a plurality of separated portions 114 in the pairs of the first protrusion 109 and the second protrusion 110 provided to the substrate guide member 104c.

The plurality of guide portions 113 are portions each having a gap in accordance with a thickness of the substrate 101 in the up-and-down direction in the pairs of the first protrusion 109 and the second protrusion 110 provided to the substrate guide member 104c and extend in the rearward direction substantially straight. With this configuration, the plurality of guide portions 113 guide the substrate in the rearward direction. The plurality of guide portions 113 are separated from each other so as to be arrayed in the front-and-rear direction.

The gap in accordance with the thickness of the substrate 101 is a substantially constant gap which enables movement of the substrate 101 in the rearward direction and regulates the movement of the substrate 101 within a predetermined range in the up-and-down direction.

Grooves formed of the plurality of guide portions 113 are arrayed at the same positions in the up-and-down direction with grooves formed of the pairs of the first protrusion 109 and the second protrusion 110 provided to each of the substrate guide member 104a and the substrate guide member 104b, that is, arrayed in the right-and-left direction. This configuration enables the substrate 101 to pass through the grooves without movements in the up, down, right, and left directions and move in the rearward direction.

The plurality of separated portions 114 are portions connecting the plurality of guide portions 113 in the pairs of the first protrusion 109 and the second protrusion 110 provided to the substrate guide member 104c. In each of the plurality of separated portions 114, the gap between the first protrusion 109 and the second protrusion 110 is larger than that of the plurality of guide portions 113.

FIG. 1 is referred back.

The terminal holding member 105 includes a fixed substrate 115 and four fixed terminals 116. The fixed substrate 115 is a substrate fixed in the cover portion 103. The four fixed terminals 116 are terminals which are associated with the four slots 102 and provided on the front surface of the fixed substrate 115. On the fixed substrate 115 of this embodiment, the four fixed terminals 116 are provided in total so that the two fixed terminals 116 are arrayed in each of the up-and-down direction and the right-and-left direction.

In the above, description is made of the configuration of the casing 100 according to one embodiment of this invention.

When the substrate 101 is to be mounted to the casing 100 according to this embodiment, a user inserts the substrate 101 to any one of the four slots 102. Then, the user moves the substrate 101 in the rearward direction along the grooves formed on the substrate guide members 104a. 104b, and 104c.

Figure 7:
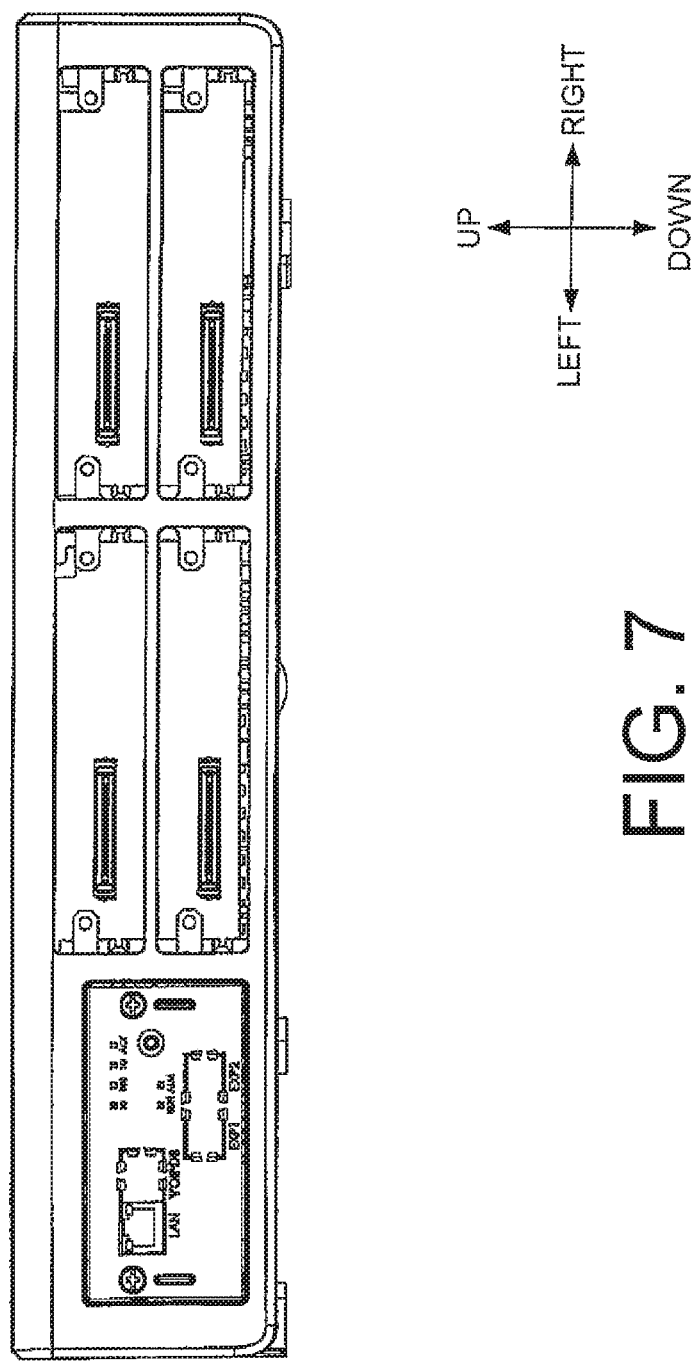
FIG. 7 is a front view for illustrating a casing according to a reference example under a state in which substrates are inserted to four slots formed in a front surface.
Figure 8:
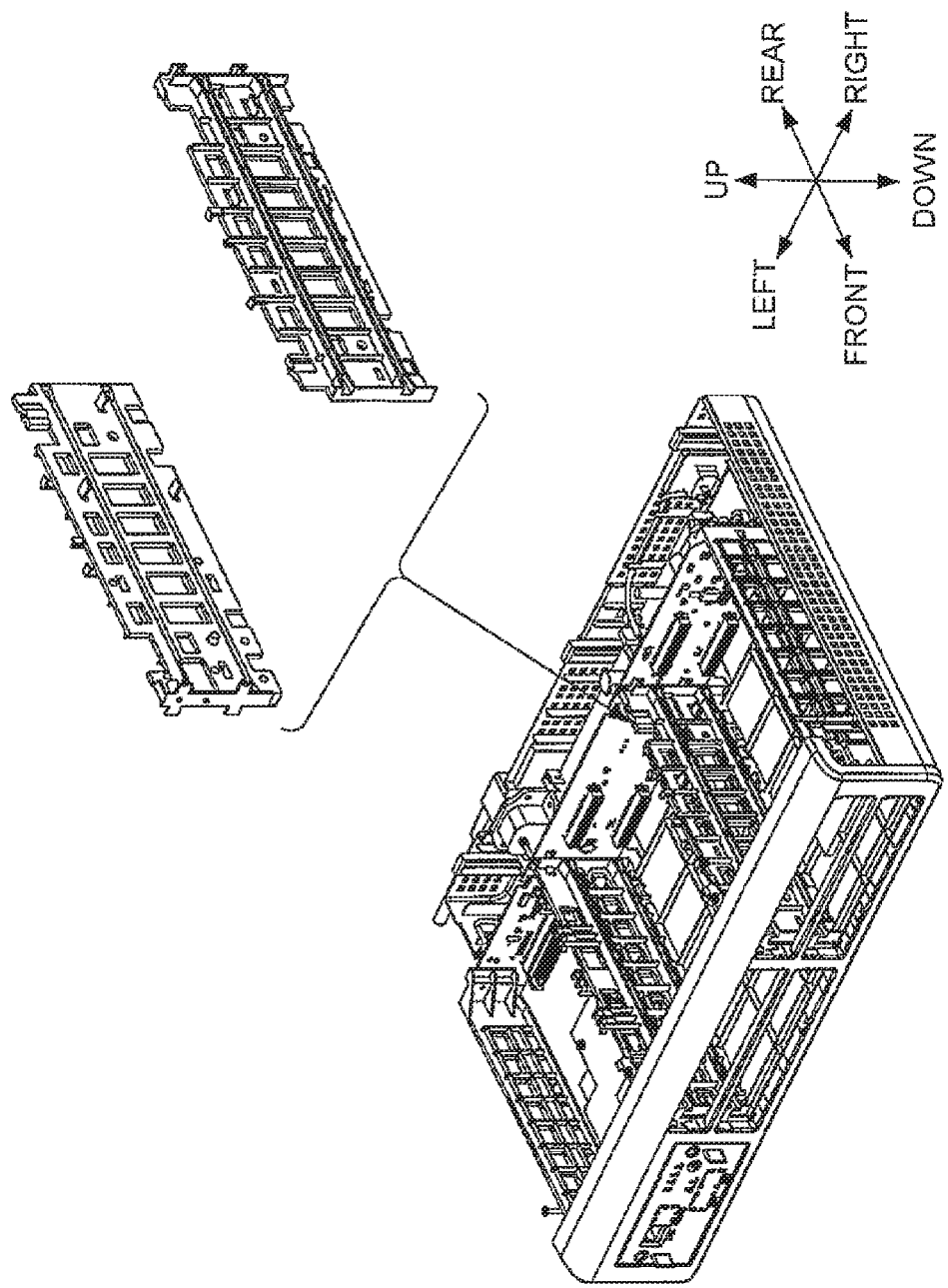
FIG. 8 is a perspective view for illustrating the casing according to the reference example under a state in which an upper cover is removed.

With this action, an inserted substrate terminal 117 provided at the front end of the substrate 101 is fitted to the fixed terminal 116 on the terminal holding member 105, thereby being capable of electrically connecting the substrate 101 and the fixed terminal 116 to each other in an easy manner. Further, under the state in which the substrate 101 and the fixed terminal 116 are electrically connected to each other, the front surface of the substrate 101 is exposed in a forward direction from the casing 100. In this embodiment, the casing 100 having the substrates 101 mounted to all of the four slots 102 is generally the same as the casing illustrated in FIG. 7 when viewed from the front side.

As described above, the substrate guide member 104c according to this embodiment includes the at least one pair of the first protrusion 109 and the second protrusion 110 forming a groove for allowing passage of the substrate 101. The at least one pair of the first protrusion 109 and the second protrusion 110 has the separated portions 114, which are portions connecting the plurality of guide portions 113 for guiding the substrate 101 in the rearward direction and are provided with larger gaps than those of the plurality of guide portions 113. Such separated portions 114 can reduce large-thickness portions of the substrate guide member 104c. Therefore, even when the substrate guide member 104 is integrally formed by resin molding, formation of the sink mark is less liable to occur. Thus, the substrate guide member 104c, which is integrally formed by resin molding with high accuracy, and the casing 100 including the substrate guide member 104c can be provided.

Further, the support portion 108 of the substrate guide member 104c according to this embodiment has through holes 111 in the array direction between mounting positions of the at least one pair of the first protrusion 109 and the second protrusion 110 constructing each of the plurality of guide portions 113. With this configuration, the large-thickness portions of the substrate guide member 104 can be reduced. Therefore, similarly to the description above, the substrate guide member 104c, which is integrally formed by resin molding with high accuracy, and the casing including the substrate guide member 104c can be provided.

Further, as in this embodiment, when three or more substrate guide members 104 are provided, the substrate guide member 104c positioned in the middle may include two pairs of the first protrusion 109 and the second protrusion 110 protruding from the portions of the support portion 108, which are opposed to each other.

In general, in the substrate guide member 104c including the pairs of the first protrusion and the second protrusion extending in the direction of separating from each other from the portions of the support portion, which are opposed to each other (in this embodiment, the left direction and the right direction), a portion being liable to be larger in thickness increases.

The substrate guiding member 104c according to this embodiment includes the separated portions 114 and the through holes 111 as described above. With this configuration, the large-thickness portions of the substrate guide member 104c can be reduced. Therefore, even when the substrate guide member 104c is integrally formed by resin molding, formation of the sink mark is less liable to occur. Thus, the substrate guide member 104c, which is integrally formed by resin molding with high accuracy, and the casing 100 including the substrate guide member 104c can be provided.

In the above, one embodiment of this invention is described. However, this invention is not limited to this embodiment. For example, this invention may be modified as described below, and may include a mode in which the embodiment and the modification examples are partially or entirely combined in a suitable manner or a mode suitably changed from the mode of combination.

MODIFICATION EXAMPLES

For example, in this embodiment, description is made with an example in which the cover portion 103 is constructed by three components including the lower cover 107, the front cover 106, and the upper cover. However, the number of components of the cover portion 103 is not limited to three, and the cover portion 103 may be constructed by any number of components.

For example, in this embodiment, description is made with an example in which only the substrate guide member 104c includes the through holes 111 and the separated portions 114. However, one or both of the through holes 111 and the separated portions 114 may suitably be employed to one or both of the substrate guide members 104a and 104b.

For example, only one of the separated portions 114 and the through holes 111 described above may be provided to the substrate guide member 104c. Even in this case, the same effect can be achieved.

Even with those modification examples, similarly to the embodiment, the large-thickness portions of the substrate guide member 104c can be reduced. Therefore, even when the substrate guide member 104c is integrally formed by resin molding, formation of the sink mark is less liable to occur. Thus, the substrate guide member 104c, which is integrally formed by resin molding with high accuracy, and the casing 100 including the substrate guide member 104c can be provided.

A part or all of the above-mentioned embodiment is described in the following supplementary notes, but is not limited to the following supplementary notes.

INDUSTRIAL APPLICABILITY

This invention is applicable to, for example, the casing for allowing insertion of the substrate from the outside so that the substrate is mounted inside, various types of equipment including the casing, and the substrate guide member employed in the casing.

Figure 3:
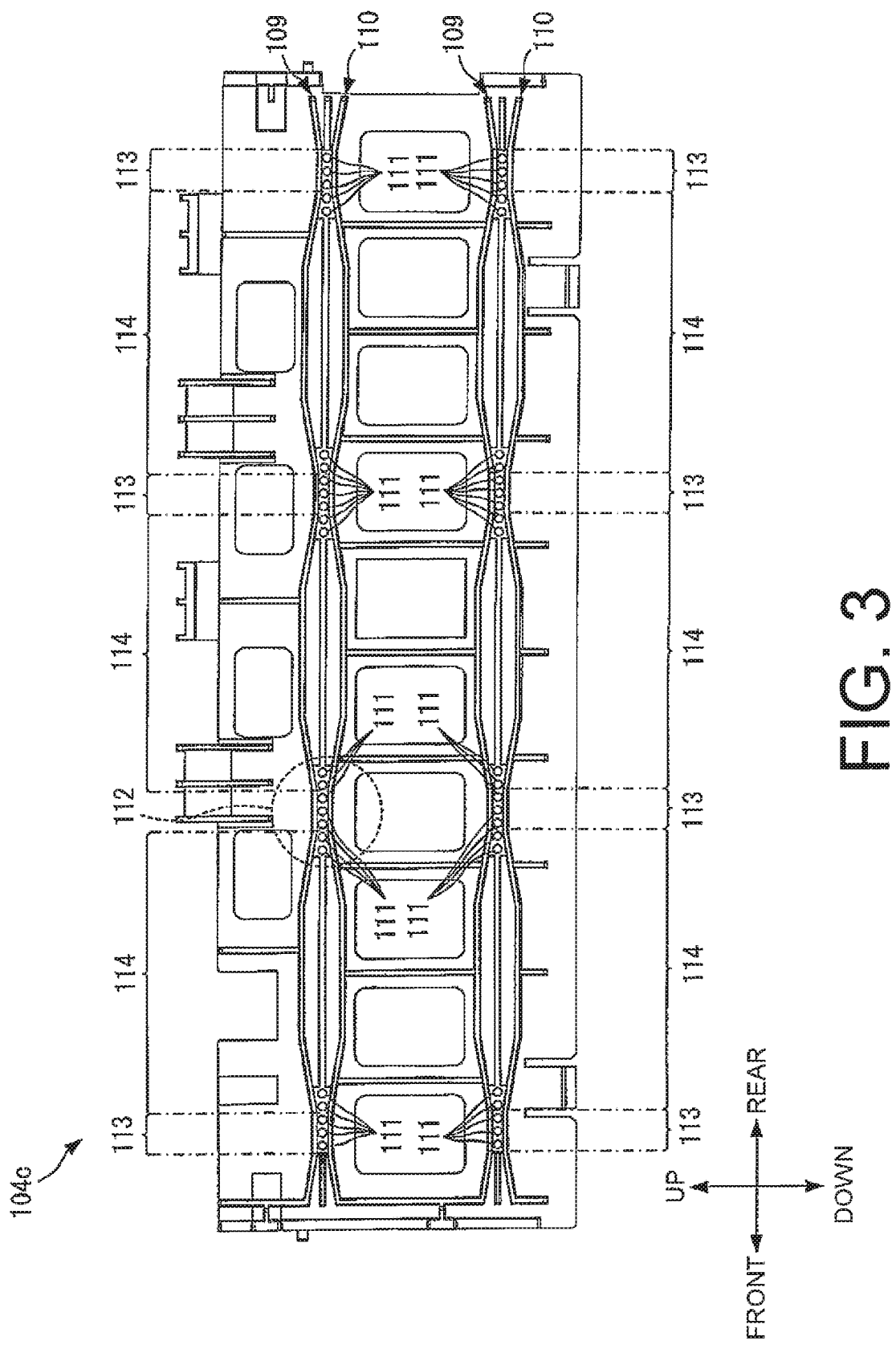
FIG. 3 is a right side view for illustrating the substrate guide member according to the one embodiment.

REFERENCE SIGNS LIST 100 casing
101 substrate
102 slot
103 cover portion
104a, 104b, 104c substrate guide member
105 terminal holding member
106 front cover
107 lower cover
108 support portion
109 first protrusion
110 second protrusion
111 through hole
112 circle in FIG. 3
113 guide portion
114 separated portion
115 fixed substrate
116 fixed terminal
117 inserted substrate terminal

The invention claimed is:

1. A substrate guide member, which is arranged in a casing having a slot for allowing insertion of a substrate from an outside so as to be arrayed in an array direction intersecting an insertion direction of the substrate and is configured to guide the substrate in the insertion direction,
the substrate guide member being integrally formed of resin and comprising:
a support portion fixed in the casing; and
at least one pair of a first protrusion and a second protrusion protruding from the support portion and extending in the insertion direction with a gap from each other, to thereby form a groove for allowing passage of the substrate,
the at least one pair of the first protrusion and the second protrusion comprising:

a plurality of guide portions, which have a constant gap in accordance with a thickness of the substrate and are configured to form the groove extending a predetermined length in the insertion direction to thereby guide the substrate in the insertion direction; and separated portions, which are portions connecting the plurality of guide portions and have a gap larger than the gap of the plurality of guide portions, the support portion having a plurality of through holes between mounting positions of the at least one pair of the first protrusion and the second protrusion constructing each of the plurality of guide portions, each of the plurality of through holes extending in the array direction, the plurality of through holes being arrayed in the insertion direction, wherein the support portion comprises a plurality of ribs and holes from above and below the pair of the first protrusion and the second protrusion.

2. A substrate guide member according to claim 1, wherein at least two pairs of the first protrusion and the second protrusion are provided, and wherein the at least two pairs of the first protrusion and the second protrusion comprise two pairs of the first protrusion and the second protrusion protruding toward adjacent substrate guide members from portions of the support portion, which are opposed to each other.

3. A casing, comprising:

a cover portion having a slot for allowing insertion of a substrate from an outside; and a plurality of substrate guide members, which are arranged in the cover portion so as to be arrayed in an array direction intersecting an insertion direction of the substrate and are each integrally formed of resin, the plurality of substrate guide members each comprising:

a support portion fixed in the cover portion; and at least one pair of a first protrusion and a second protrusion protruding from the support portion to an adjacent substrate guide member and extending in the insertion direction with a gap each other, to thereby form a groove for allowing passage of the substrate, the at least one pair of the first protrusion and the second protrusion comprising:

a plurality of guide portions, which have a constant gap in accordance with a thickness of the substrate and are configured to form a groove extending a predetermined length in the insertion direction to thereby guide the substrate in the insertion direction; and separated portions, which are portions connecting the plurality of guide portions and have a gap larger than the gap of the plurality of guide portions, the support portion having a plurality of through holes between mounting positions of the at least one pair of the first protrusion and the second protrusion constructing each of the plurality of guide portions, each of the plurality of through holes extending in the array direction, the plurality of through holes being arrayed in the insertion direction, wherein the support portion comprises a plurality of ribs and holes from above and below the pair of the first protrusion and the second protrusion.

4. A casing according to claim 3, wherein the plurality of substrate guide members comprise three or more substrate guide members, wherein a substrate guide member positioned in the middle among the plurality of substrate guide members comprises at least two pairs of the first protrusion and the second protrusion, and wherein the at least two pairs of the first protrusion and the second protrusion comprise two pairs of the first protrusion and the second protrusion protruding from portions of the support portion, which are opposed to each other.

* * * * *

UNITED STATES PATENT AND TRADEMARK OFFICE
CERTIFICATE OF CORRECTION

PATENT NO. : 10,585,461 B2
APPLICATION NO. : 15/567717
DATED : March 10, 2020
INVENTOR(S) : Takeshi Suzuki Page 1 of 1

It is certified that error appears in the above-identified patent and that said Letters Patent is hereby corrected as shown below:

In the Claims

Column 8, Line 63; Claim 1, after "gap", delete "from"

Column 10, Line 8; Claim 3, delete "a groove" and insert --the groove-- therefor Signed and Sealed this
Fourteenth Day of July, 2020

Andrei Iancu
*Director of the United States Patent and Trademark Office*